US008384993B2

(12) United States Patent
Landais et al.

(10) Patent No.: US 8,384,993 B2
(45) Date of Patent: Feb. 26, 2013

(54) SEMICONDUCTOR OPTICAL AMPLIFIER WITH A REDUCED NOISE FIGURE

(75) Inventors: Pascal Landais, Dublin (IE); Frederic Surre, London (GB)

(73) Assignee: Dublin City University, Dublin (IE)

( * ) Notice: Subject to any disclaimer, the term of this patent is extended or adjusted under 35 U.S.C. 154(b) by 733 days.

(21) Appl. No.: 12/626,373

(22) Filed: Nov. 25, 2009

(65) Prior Publication Data

US 2010/0134877 A1 Jun. 3, 2010

(30) Foreign Application Priority Data

Nov. 26, 2008 (GB) .................................. 0821602.0

(51) Int. Cl.
*H01S 5/026* (2006.01)
*H01S 5/065* (2006.01)

(52) U.S. Cl. ........................................ 359/344; 359/346
(58) Field of Classification Search .................... 359/344
See application file for complete search history.

(56) References Cited

U.S. PATENT DOCUMENTS

| | | | | | |
|---|---|---|---|---|---|
| 3,828,231 | A | * | 8/1974 | Yamamoto | 359/344 |
| 4,794,346 | A | * | 12/1988 | Miller | 359/344 |
| 4,852,108 | A | * | 7/1989 | Utaka et al. | 372/20 |
| 5,119,393 | A | * | 6/1992 | Oka et al. | 372/50.22 |
| 5,379,318 | A | * | 1/1995 | Weber | 372/96 |
| 5,521,754 | A | * | 5/1996 | Nitta et al. | 359/344 |
| 5,568,311 | A | * | 10/1996 | Matsumoto | 359/344 |
| 5,608,572 | A | * | 3/1997 | Nitta et al. | 359/344 |
| 5,703,892 | A | * | 12/1997 | Claisse et al. | 372/32 |
| 5,715,268 | A | * | 2/1998 | Lang et al. | 372/50.22 |
| 5,946,336 | A | * | 8/1999 | Mizutani et al. | 372/50.1 |
| 6,026,107 | A | * | 2/2000 | Huang | 372/50.1 |
| 6,252,895 | B1 | * | 6/2001 | Nitta et al. | 372/50.1 |
| 6,347,104 | B1 | | 2/2002 | Dijaili et al. | |
| 6,563,631 | B2 | * | 5/2003 | Delprat et al. | 359/344 |
| 6,597,497 | B2 | * | 7/2003 | Wang et al. | 359/344 |
| 6,614,817 | B2 | * | 9/2003 | Nomura et al. | 372/18 |
| 6,678,289 | B2 | * | 1/2004 | Kim | 372/20 |
| 6,731,427 | B1 | * | 5/2004 | Wu | 359/344 |
| 6,751,013 | B1 | * | 6/2004 | Wu | 359/337 |
| 6,978,057 | B1 | * | 12/2005 | O'Gorman et al. | 385/14 |

(Continued)

FOREIGN PATENT DOCUMENTS

JP 2003124578 A 4/2003
JP 2006120862 A 5/2006

OTHER PUBLICATIONS

A. Abd El Aziz, W.P. Ng, Z. Ghassemlooy, M.H. Aly, M.F. Chiang, Optimisation of the key SOA parameters for amplification and switching, PGNet, 2008. http://nrl.northumbria.ac.uk/2131/1/Optimisation%20of%20the%20Key%20SOA%20Parameters%20for%20amplification%20and %20switching.pdf.*

*Primary Examiner* — Mark Hellner
*Assistant Examiner* — Ari M Diacou
(74) *Attorney, Agent, or Firm* — Seed IP Law Group PLLC

(57) ABSTRACT

A semiconductor optical amplifier for amplifying an optical signal. The amplifier comprises an input for receiving the optical signal and an output for outputting an amplified version of the optical signal. A semiconductor active medium is provided for defining an amplification path extending between the input and the output for amplifying the optical signal as the optical signal propagates along the amplification path. A control means selectively controls the amplified spontaneous emission (ASE) of the semiconductor optical amplifier. The control means is co-operable with the active medium for selectively varying carrier density along the amplification path.

44 Claims, 6 Drawing Sheets

U.S. PATENT DOCUMENTS

| | | | |
|---|---|---|---|
| 7,079,310 B2 * | 7/2006 | Chen | 359/337 |
| 7,079,721 B2 * | 7/2006 | Kish et al. | 385/14 |
| 7,081,643 B2 * | 7/2006 | Lee et al. | 257/98 |
| 7,126,750 B2 * | 10/2006 | Wasserbauer | 359/344 |
| 7,167,301 B2 * | 1/2007 | Akiyama | 359/344 |
| 7,265,898 B2 * | 9/2007 | Wang et al. | 359/344 |
| 7,512,295 B2 * | 3/2009 | Welch et al. | 385/14 |
| 7,643,207 B2 * | 1/2010 | Dagens et al. | 359/344 |
| 8,149,503 B2 * | 4/2012 | Kim et al. | 359/344 |
| 2002/0067540 A1 * | 6/2002 | Delprat et al. | 359/344 |
| 2002/0093731 A1 * | 7/2002 | Tombling et al. | 359/344 |
| 2002/0105991 A1 * | 8/2002 | Coldren et al. | 372/50 |
| 2003/0067675 A1 * | 4/2003 | Wang et al. | 359/344 |
| 2003/0067677 A1 * | 4/2003 | Islam et al. | 359/344 |
| 2004/0012845 A1 * | 1/2004 | Wang | 359/344 |
| 2004/0091009 A1 * | 5/2004 | Matsuda et al. | 372/43 |
| 2004/0246567 A1 * | 12/2004 | Ahn et al. | 359/337 |
| 2005/0111079 A1 * | 5/2005 | Wang et al. | 359/344 |
| 2005/0185263 A1 | 8/2005 | Lee et al. | |

\* cited by examiner

SEMICONDUCTOR OPTICAL AMPLIFIER WITH A REDUCED NOISE FIGURE

FIELD OF THE INVENTION

The present invention relates to a semiconductor optical amplifier (SOA) with a reduced noise figure. The present invention more particularly relates to a semiconductor optical amplifier with a control arrangement for selectively varying the carrier density along the amplification path thereby selectively controlling the amplified spontaneous emission (ASE) and consequently the noise figure.

BACKGROUND

Semiconductor Optical Amplifiers (SOA) are essential components in optical networks. Besides acting as optical amplifiers, their inherent non-linearities allow them to form the basis of many signal processing elements (e.g. wavelength converters, logic gates). Compared to the Erbium Doped fibre amplifier (EDFA), Erbium Doped waveguide amplifier (EDWA) or Raman amplifier, the SOA has many advantages: lower cost, larger bandwidth, smaller size, and the potential to be integrated on a chip with electrical pumping. However SOAs suffer from the disadvantage that they have a higher noise figure than EDFA or EDWA amplifiers.

Attempts have been made to reduce the noise figure of SOAs. One solution involved embedding a lasing cavity inside the SOA. However, this arrangement resulted in a significant reduction of gain because at a certain level of bias current, the SOA starts lasing, this results in clamping of the carrier density at a specific value corresponding to when the gain equals the cavity losses.

Therefore there is a need for a semiconductor optical amplifier with a reduced noise figure and a relatively high gain.

SUMMARY

These and other problems are addressed by providing a semiconductor optical amplifier with a control arrangement for selectively varying the carrier density along the amplification path.

Accordingly, a first embodiment of the invention provides a semiconductor optical amplifier as detailed in claim 1. The invention also relates to a processing element as detailed in claim 42. Additionally, the invention relates to an electronic chip as detailed in claim 43. Advantageous embodiments are provided in the dependent claims.

These and other features will be better understood with reference to the followings Figures which are provided to assist in an understanding of the teaching of the invention.

BRIEF DESCRIPTION OF THE DRAWINGS

The present invention will now be described with reference to the accompanying drawings in which.

DETAILED DESCRIPTION OF THE DRAWINGS

Figure 1:
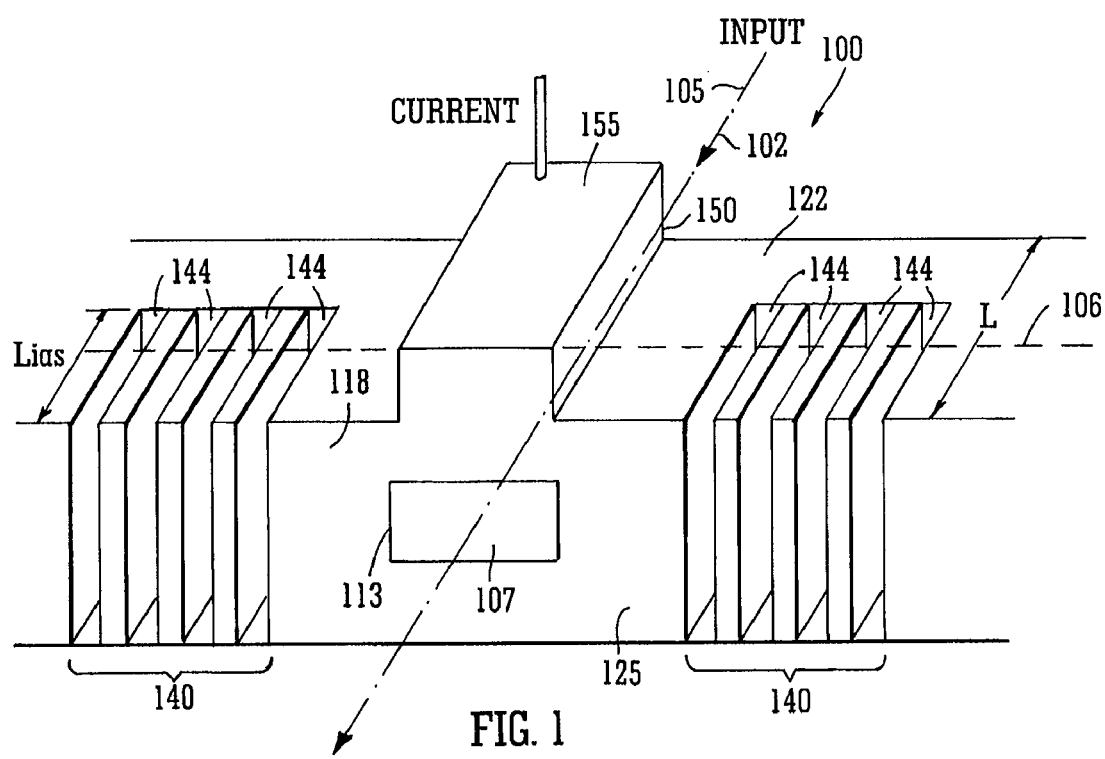
FIG. 1 is a perspective view of a semiconductor optical amplifier (SOA) in accordance with the present invention.
Figure 2:
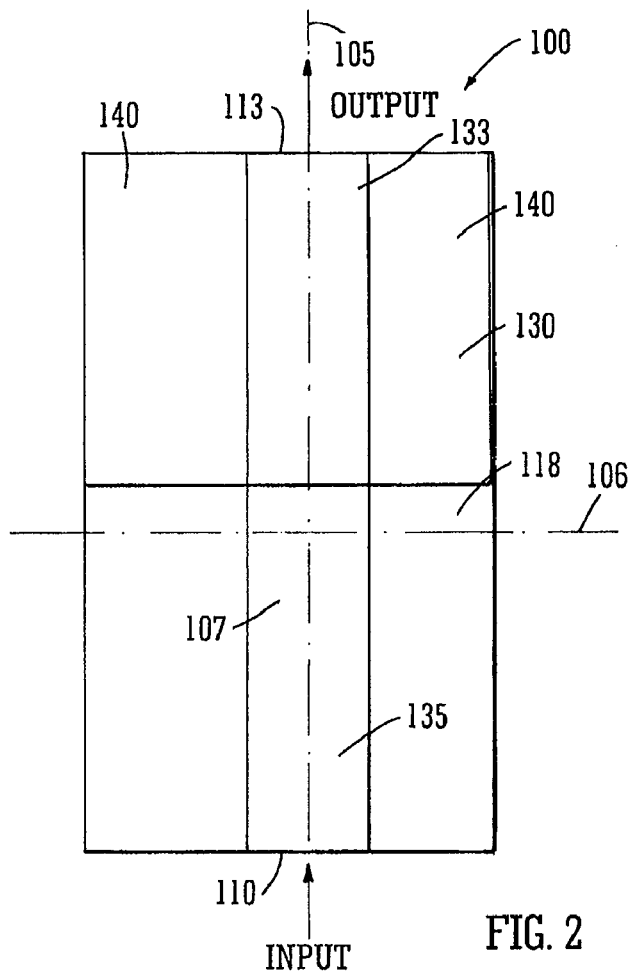
FIG. 2 is a cross sectional plan view of the SOA of FIG. 1.
Figure 3:
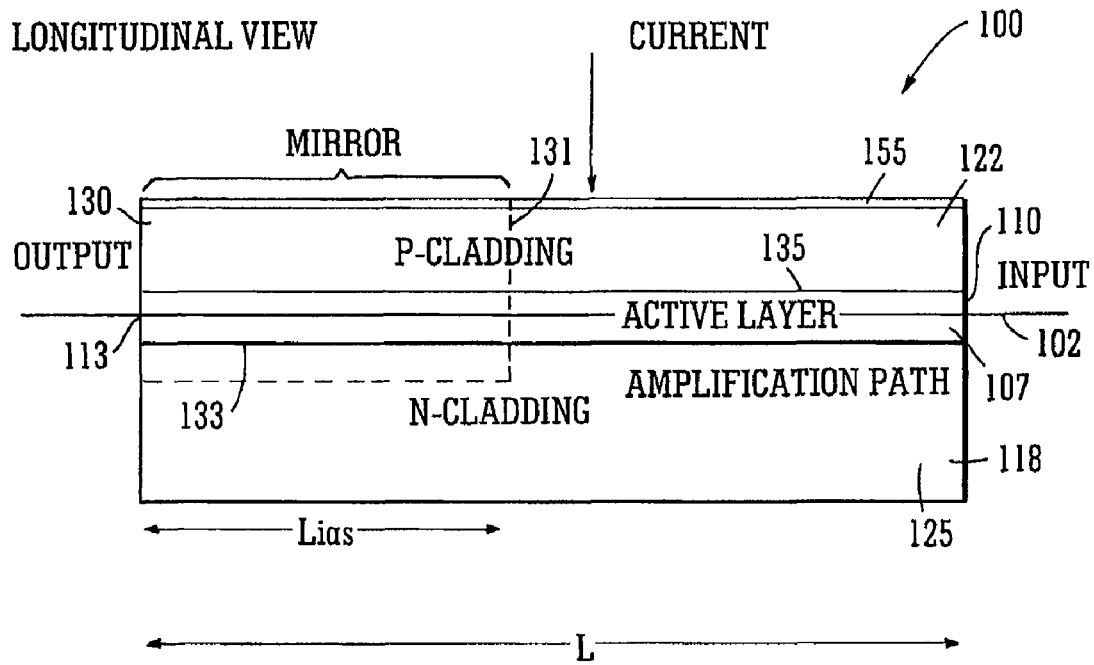
FIG. 3 is a cross sectional side view of the SOA of FIG. 1

The invention will now be described with reference to some exemplary semiconductor optical amplifiers (SOA) which are provided to assist in an understanding of the teaching of the invention.

Referring to the drawings and initially to FIGS. 1 to 4 there is provided a semiconductor optical amplifier (SOA) 100 for amplifying an optical signal 102. The present inventors have realised that by providing the SOA 100 with a control arrangement for selectively varying the carrier density along an amplification path significantly reduces the amplified spontaneous emission (ASE) associated with the SOA 100 which in turn reduces the noise figure. The SOA 100 defines a longitudinal axis 105 and a transverse axis 106 which is orthogonal to the longitudinal axis 105. A semiconductor active medium 107 is provided on the SOA 100 which defines a single mode amplification path for amplifying the optical signal 102 as the optical signal 102 propagates along the amplification path. The active medium 107 has substantially uniform dimensions and is arranged to be coaxial with the longitudinal axis 105. The active medium 107 extends between an input 110 and a spaced apart output 113 which accommodates the optical signal 102 there through. In this exemplary arrangement, the active medium 107 is an elongated strip and is encapsulated (surrounded) by cladding 118. The cladding 118 comprises a p-type cladding layer 122 and an n-type cladding type layer 125 which together encapsulate the active medium 107. The p-type cladding layer 122 and the n-type cladding layer 125 together with the active medium form an SOA junction. The active medium 107 may comprises any suitable amplification material such as but not limited to Quantum wells, Multiple Quantum Wells, bulk material, q-dot, q-dash. Semiconductor active materials are well known to those skilled in the art, and is not intended to describe the active medium further.

In this embodiment the control means comprises a lasing cavity 130 located on the cladding 118 for providing lateral lasing conditions in the amplification path towards the output 113. For illustrative purposes the lasing cavity 130 can be considered to be enclosed by the dashed line 131 in FIG. 3. The lasing cavity 130 extends from the output 113 and terminates spaced apart from the input 110. The active medium 107 along the length of the lasing cavity 130 forms part of the lasing cavity 130. Thus, the lasing cavity 130 includes the amplification path towards the output 113 but not the amplification path towards the input 110 as the lasing cavity 130 does not extend the full length of the active medium 107. In this exemplary arrangement the lasing cavity 130 is of length which corresponds to approximately 60% of the length of the active medium 107, as illustrated best in FIG. 2. Therefore approximately 40% of the length of the active medium is not included in the lasing cavity 130. The lasing cavity 130 divides the amplification path into two distinct portions, namely, a lasing portion 133 which forms part of the lasing cavity 130 and a non-lasing portion 135 which is not part of the lasing cavity 130. The size of the lasing and non-lasing portions may vary depending on the application to which the SOA 100 is applied. The precise values of 40% and 60% are given by way of example only, and it is not intended to limit the SOA 100 to these precise values. The lasing cavity 130 is arranged for facilitating transverse lasing with respect to the direction of the optical signal 102 as the optical signal 102 propagates along the lasing portion 133 of the amplification path. When lasing occurs in the lasing cavity 130 it sets the carrier distribution in the lasing portion 133 to a predetermined gain value. It will be appreciated by those skilled in the art that the gain in the non-lasing portion 135 remains substantially unaffected by lasing conditions in the lasing cavity 130.

Figure 4:
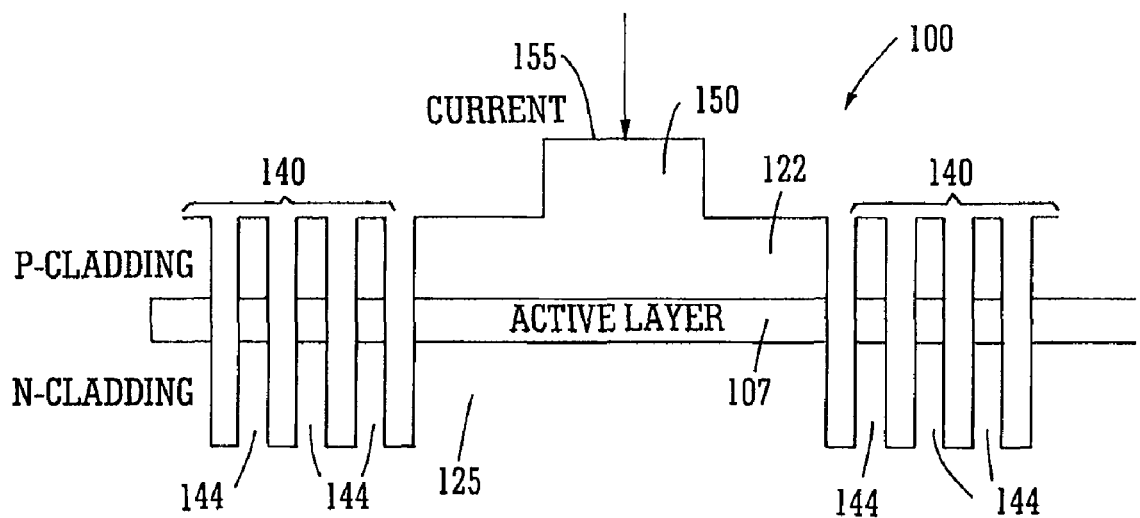
FIG. 4 shows the SOA with the active medium extending into the mirrors.

The lasing cavity 130 also comprises a pair of highly reflective mirrors 140 located on respective opposite sides of the active medium 107. Lateral cavities 144 are formed on the cladding 118 for accommodating the respective mirrors 140 therein. While FIG. 1 shows the mirrors 140 of uniform dimensions, in an alternative arrangement, the dimensions of the mirrors 140 progressively increase along the lasing portion 133 towards the output 113 such that the mirrors 140 define a stair case arrangement when viewed in plan view. In this arrangement the steps of the mirrors 140 may be provided as discrete segments. The mirrors 140 may be any suitable type such as Bragg reflectors. It is not intended to limit the mirrors 140 to any particular configuration or type, Bragg reflectors are given by way of example only. While the mirrors 140 have been shown to be spaced apart from the active medium 107, the present inventors envisage that the active medium 107 may be extended into the mirrors 140 as illustrated in FIG. 4. The mirrors 140 in the exemplary arrangement consist of air and cladding material. However, it will be appreciated by those skilled in the art that the mirrors 140 may be formed from a mix of dielectric materials.

The p-type cladding layer 122 defines a platform in the form of a ridge 150, in this case, of rectangular cross sectional area on which an electrical contact 155 is supported for facilitating pumping the active medium 107 with current, as best illustrated in FIG. 1. The electrical contact 155 is substantially the same width as the active medium 107. The electrical contact 155 defines a longitudinal axis which is substantially coaxial with the longitudinal axis 105 of the SOA 100. The electrical contact 155 is in registration with the active medium 107 and spaced apart therefrom by the P-type cladding layer 122. It is not intended to limit the invention to the pumping arrangement described in the exemplary embodiment. It will be appreciated by those skilled in the art that alternative arrangements may be provided for pumping the active medium 107 with current.

In operation, the SOA 100 receives the optical signal 102 to be amplified at the input 110 of the amplification path. As the optical signal 102 propagates along the amplification path the semiconductor active medium 107 amplifies the optical signal 102 such that an amplified version of the optical signal 102 is emitted from the output 113 of the amplification path. The semiconductor active medium 107 is pumped with current by applying electrical current to the electrical contact 155. The pumping of the active medium 107 with current causes the P-type cladding layer 122 to inject holes into the active medium 107, and the N-type cladding layer 125 to inject electrons into the active medium 107 resulting in the active medium 107 being pumped with carriers. The operation of SOA junctions are well known to those skilled in the art and it is therefore not intended to describe them further.

When the current applied to the electrical contact 155 reaches a certain level the lasing threshold of the lasing portion 133 is reached. Once the lasing threshold is reached the round-trip gain equals the round-trip losses for the lasing cavity 130. It will be appreciated by those skilled in the art that the gain of the semiconductor active medium 107 in the lasing portion 133 is clamped to the gain value required to offset the round-trip losses and consequently the carrier number is clamped. The optical signal 102 is amplified according to this gain value in the lasing portion 133 of the amplification path. However, as the non-lasing portion 135 of the amplification path does not include the lasing cavity 130 no lasing occurs in the non-lasing portion 135 of the amplification path. Thus, the gain of the semiconductor active medium 107 in the non-lasing portion 135 is unaffected by lasing conditions as the carriers are not clamped to offset round trip losses associated with lasing. It will be appreciated therefore by those skilled in the art that the gain of the non-lasing portion 135 is not clamped to a gain value set by lasing conditions but to the gain characteristics of the semiconductor active medium 107. Thus, the potential gain in the non-lasing portion 135 is significantly higher than in the lasing portion 133. The lasing cavity is arranged for clamping a predetermined percentage of the active medium to a predetermined gain value. The percentage of the active medium which is clamped may be one of the following ranges 20% to 90%, 30% to 80%, 40% to 70%, 50% to 60%, and 60% to 70% which are given by way of example.

The active medium 107 of the SOA 100 produces spontaneous emission (SE) which is amplified from the amplification process. Amplified spontaneous emission (ASE) is a light matter interaction which is a spurious effect in optical amplification acting like noise. The injected signal 102 has a signal-to-noise ratio (S/N). When the signal is injected into the amplification path the noise level increases due to the ASE. To quantify the reduction of the S/N the noise figure (NF) is used. It corresponds to the ratio of the S/N at the input to the S/N at the output. This ratio is typically greater than 1.

The present inventors provide an amplification path with a lasing portion and a non-lasing portion for reducing the effects of ASE which in turn reduces the noise figure of the SOA 100. The spontaneous emission (SE) generated at the input 110 which propagates towards the output 113 is mostly amplified in the non-lasing portion 135 of the SOA. The SE generated at the output 113 which propagates from the output 113 towards the input 110 is amplified less by the lasing portion 133 as the carrier density in this section of the amplification path is clamped by the lasing effects. The SE is mostly amplified by the non-lasing portion 135 and not so much by the lasing portion 133. As a consequence of the amplification path having a lasing portion and a non-lasing portion results in carriers in the non-lasing portion of the SOA 100 being consumed mostly by the amplification process of the injected signal and rather than by the spontaneous emission process. A reduction of the ASE travelling from the output to the input results in an automatic increase of the carrier density at the input section of the amplification path which reduces the NF of the input section and as a consequence (assuming the output is well designed) lowers the overall NF of the SOA. In this way the ratio of amplification of the optical signal with respect to ASE is controlled, such that the optical signal is preferentially amplified with respect to the ASE.

Figure 5:
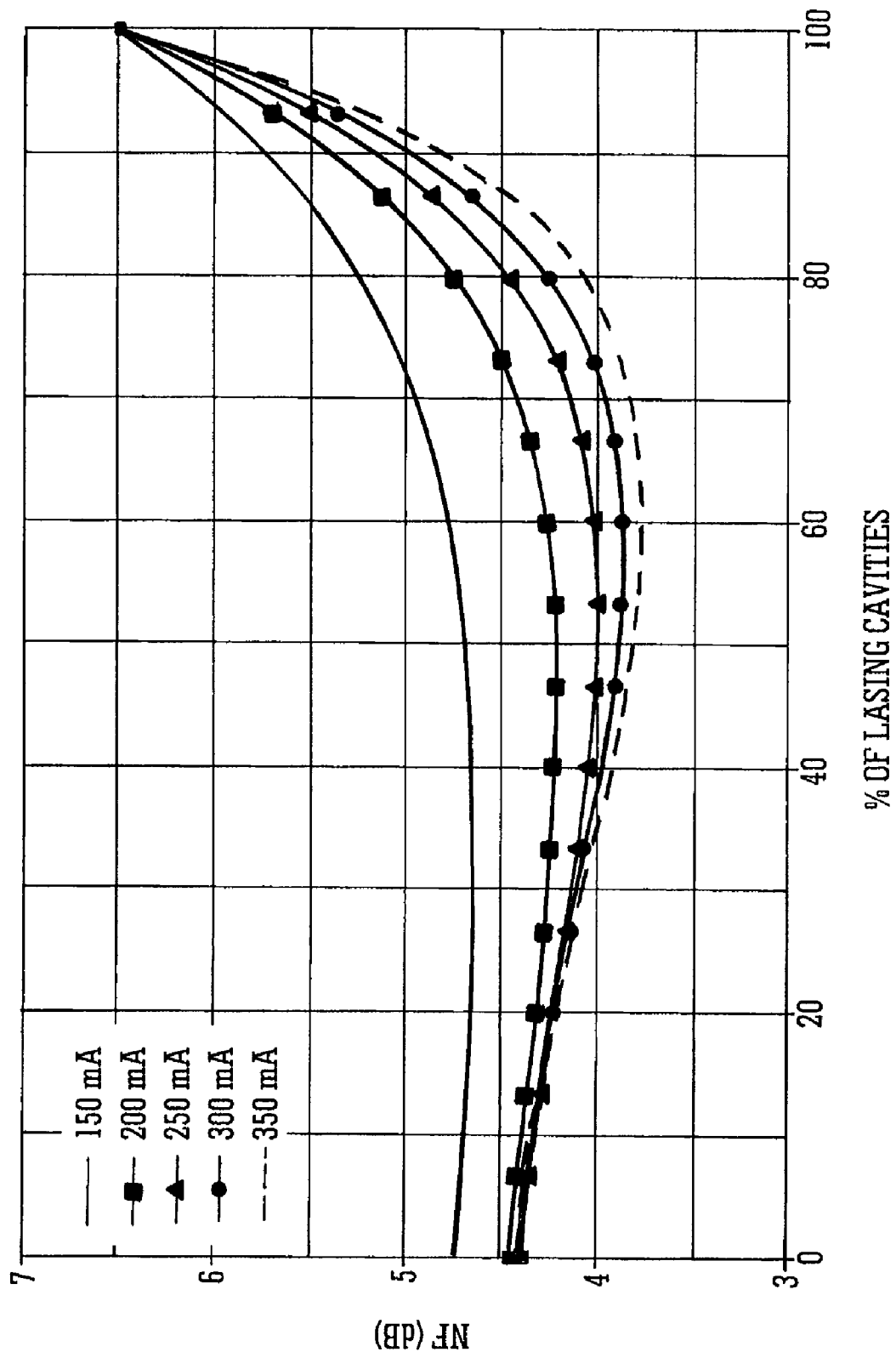
FIG. 5 shows a graph of the noise figure of the SOA of FIG. 1 as a function of the percentage of the lasing portion for various values of pumping currents.
Figure 6:
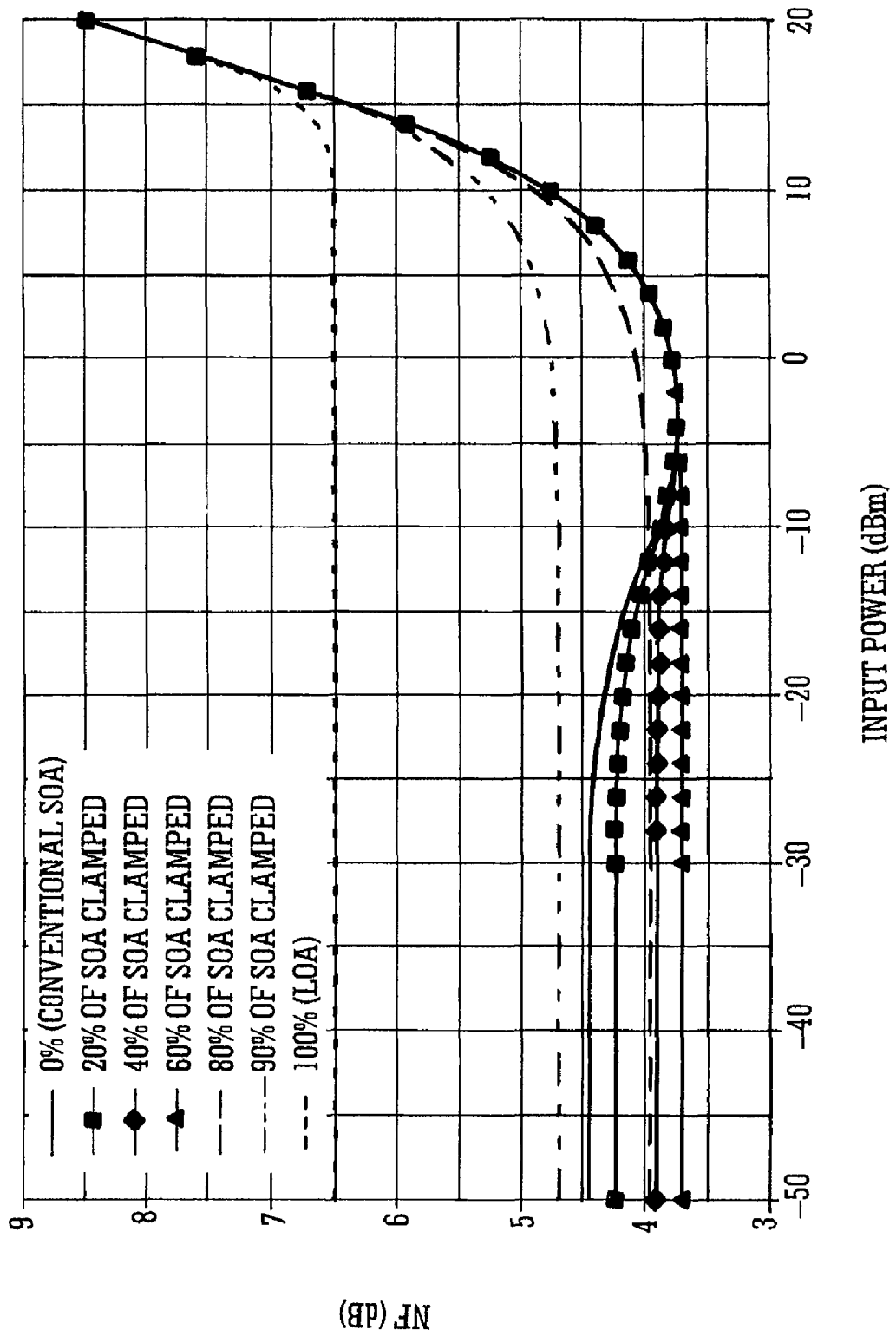
FIG. 6 shows a graph of the noise figure of the SOA of FIG. 1 as a function of the input power for various values of lasing proportions.
Figure 7:
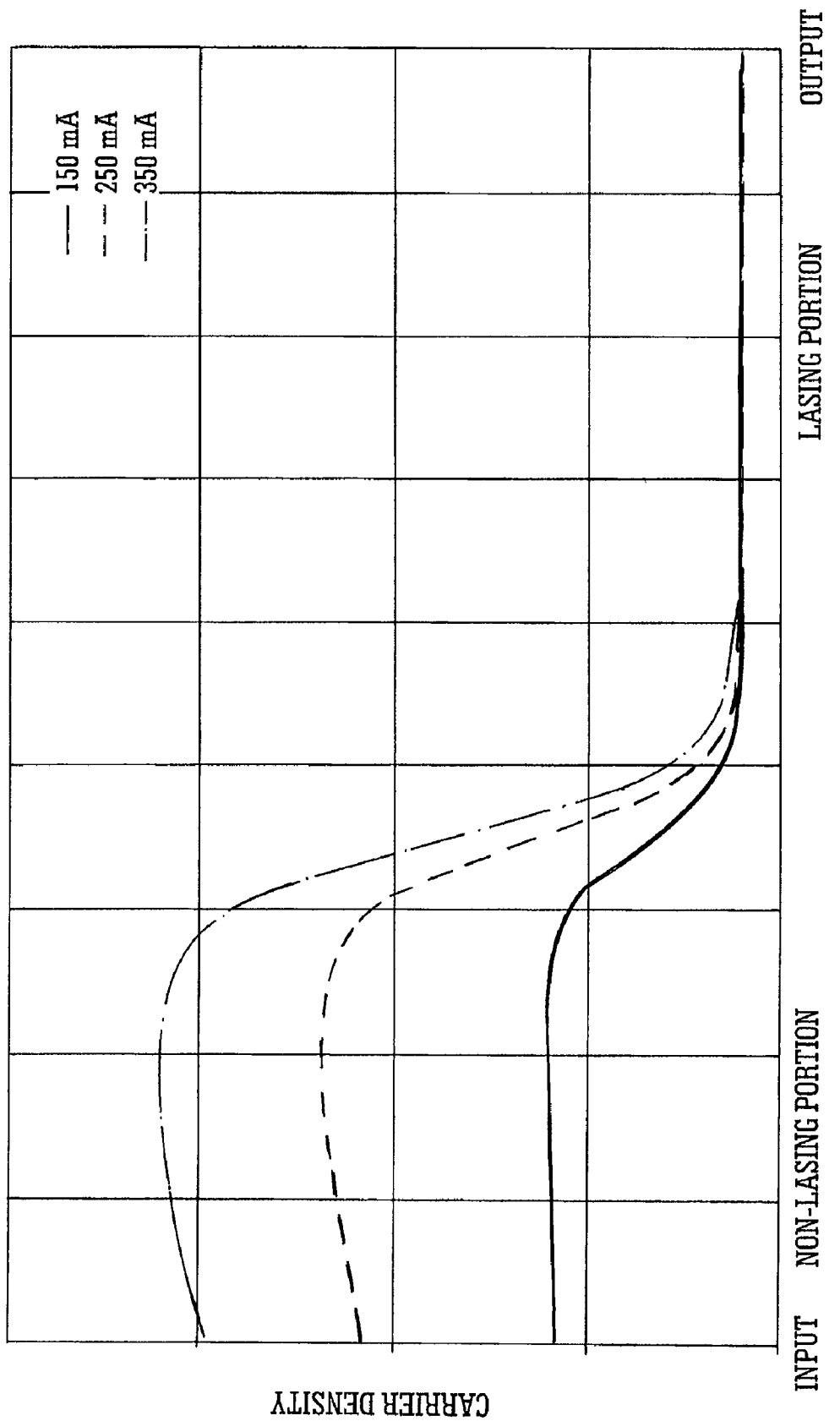
FIG. 7 shows the carrier density distribution as a function of position along the amplified path of the SOA of FIG. 1 for various values of pumping currents.

Referring now to the graphs of FIGS. 5 to 7, the graph of FIG. 5 shows the noise figure of the SOA 100 as a function of the percentage of the lasing portion 133 occupying the amplification path (active medium 107). A number of different bias currents, in this case, 150 mA, 200 mA, 250 mA, 300 mA, 350 mA are applied to the electrical contact 155 at different times. The noise figure for all bias currents is the lowest when the lasing portion occupies ~60% of the active medium. The graph of FIG. 6 shows the noise figure of the semiconductor optical amplifier 100 as a function of the input power. When the lasing portion 133 occupies ~20% to 60% of the amplification path results in the lowest noise figure. The conventional SOA with no embedded lasing cavity (0% conventional SOA) has a higher noise figure than SOAs with a lasing portion 133 that occupies ~20% to 60% of the amplification path until the input power reached ~−5 dBm. An SOA with a lasing cavity occupying the full length of the amplification path (100% LOA) has the highest noise figure which is substantially independent of the injected power. The values of the pump current are given by way of example only and it is not intended to limit the pump currents to these particular values.

Referring now to the graph of FIG. 7 which shows the carrier density distribution along the amplification path of the SOA 100 for three values of bias current, in this case, 150 mA, 250 mA and 350 mA. The non-lasing portion 135 has a high carrier density concentration as this region of the amplification path does not experience lasing to consume the carriers. The lasing portion 133 has a low carrier density as this region of the amplification path experiences lasing conditions. Thus, the non-lasing portion defines a region of high carrier concentration, and the lasing portion defines a region of low carrier concentration. The carrier concentration gradient along the amplification path defines a maximum occurring in the non-lasing portion and a minimum in the lasing portion. Various values of pumping current may be applied for shifting the maximum to a desirable value while the minimum remains substantially unaffected by the pumping current. As the noise figure (NF) is inversely proportional to carrier density (N), the non-lasing portion also defines a region with a relatively low noise figure, and the lasing portion defines a region with a higher noise figure than the non-lasing portion 135. Thus, the noise figure of the non-lasing portion 135 is less than the noise figure of the lasing portion 133. The noise figure of the non-lasing portion 135 is substantially equal to the noise figure of the overall SOA 100. The overall NF of the device is given according to the following formula:

$$nf_T = nf_1 + \frac{nf_2 - 1}{g_1} + \frac{nf_3 - 1}{g_1 \cdot g_2} + \frac{nf_4 - 1}{g_1 \cdot g_2 \cdot g_3} + \ldots$$

Where:
g is the gain per section, and
nf is the noise figure per section.
When the lasing threshold of the lasing cavity 130 is reached, the round-trip gain equals the round-trip losses. The gain of the semiconductor active medium 107 in the lasing portion 133 is clamped to the gain value required to offset the round-trip losses. The optical signal 102 is amplified in the lasing portion 133 according to the clamped gain value resulting from lasing. When the combined ASE propagates from input 110 to output 113, only the non-lasing portion 135 of the SOA 100 contributes significantly to the amplification of its level. When $ASE_2$ propagates from output 113 to input 110, the carrier density in the lasing portion 133 is clamped by the lasing effect. Thus, the lasing portion 133 does not contribute significantly to the amplification of ASE. The overall level of the ASE associated with the SOA 100 is kept low as amplification of the spontaneous emission ASE associated to the active medium is significantly reduced compared to SOA's known heretofore.

Figure 8:
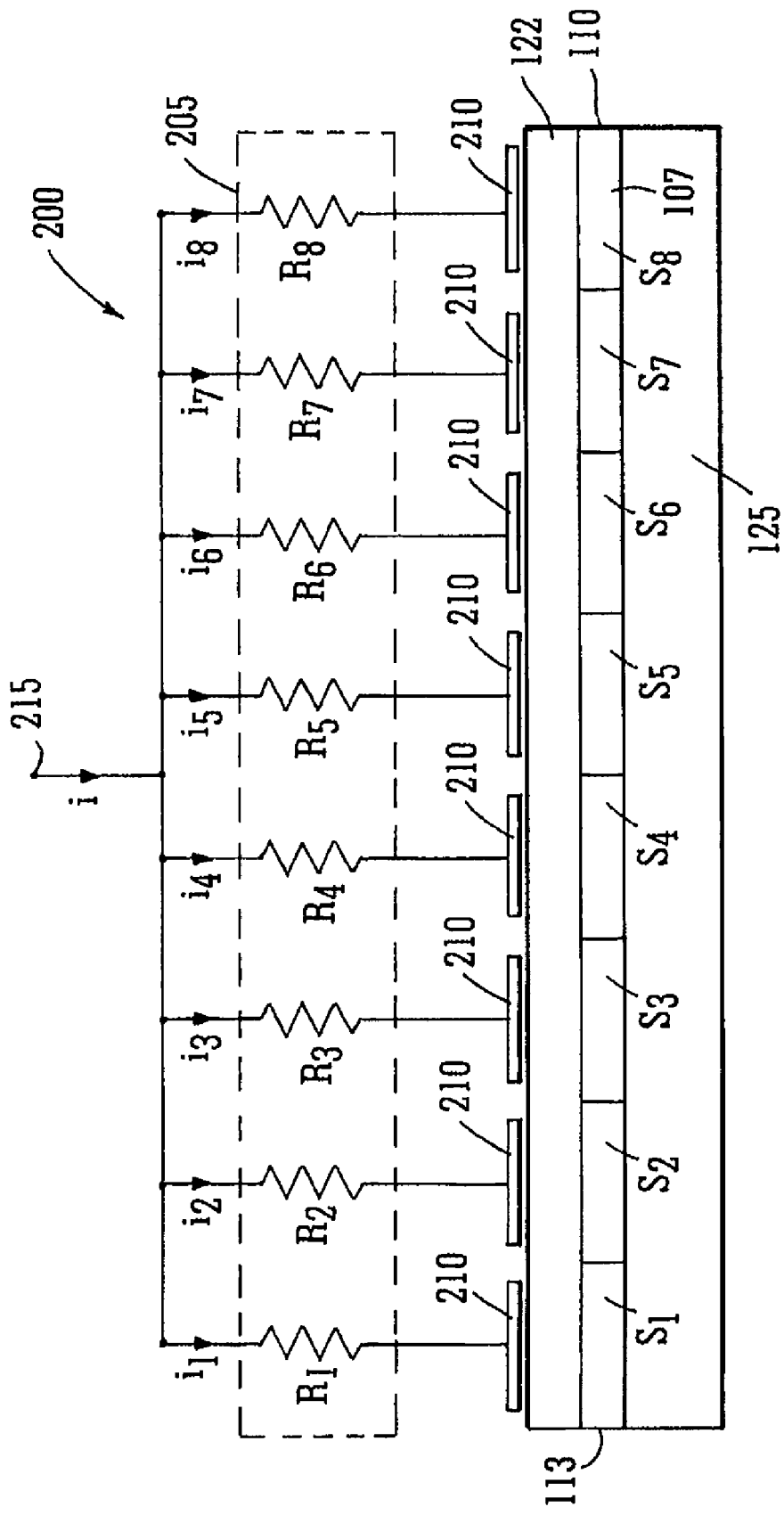
FIG. 8 is a perspective view of another semiconductor optical amplifier (SOA) in accordance with the present invention.

Referring now to FIG. 8 there is provided another optical amplifier 200 for amplifying an optical signal. The optical amplifier 200 is substantially similar to optical amplifier 100 and like components are indicated by the same reference numerals. The main difference between the optical amplifier 200 and the amplifier 100 is that the control means is provided as a resistor network 205 instead of a lasing cavity 130. A plurality of electrical contacts 210 are located along the p-type cladding layer 122 for pumping the active medium with current of varying levels thereby selectively varying the carrier density along the amplification path which in turn selectively controls the amplified spontaneous emission (ASE) associated with the SOA 200. The resistor network 205 divides the amplification path into a plurality of discrete sections $s_1$-$s_8$ each being independently biased with a corresponding one of the pump currents $i_1$-$i_8$. In this exemplary arrangement, the carrier density is controlled to define a first portion of the amplification path which contributes to a major part of the amplified spontaneous emission (ASE), and a second portion which contributes to a minor part of the amplified spontaneous emission. The resistor network 205 is operably coupled to the electrical contacts 210 such that the active medium is pumped with currents of varying levels which progressively decrease from the input 110 to the output 113. The resistance of the resistors $R_1$ to $R_8$ are determined by characteristics of the active material 107 and the desired current in each section. The resistor network 205 can be provided as discrete resistors or as integrated resistors fabricated on the SOA 200. The resistor network 205 divides the current applied at an input node 215 into plurality of discrete currents $i_1$ to $i_8$ which pump corresponding sections $s_1$ to $s_8$ of the active medium 107. The resistor network 205 is given by way of example only, it will be appreciated by those skilled in the art that it be may provided with any desired number of resistors or configurations.

The SOA 100 and the SOA 200 may be provided as signal processing elements in an optical network. Additionally, the SOA 100 and the SOA 200 may be provided as electronic chips. It will be understood that what has been described herein are some exemplary embodiments of a SOA for amplifying an optical signal. Exemplary arrangements include control means being co-operable with the active medium for selectively varying carrier density along the amplification path to improve the signal to noise ratio of the output optical signal. In this way the variance of the carrier density is used to change the ratio of amplification of the optical signal with respect to any background noise such as that contributed from SE. While the present invention has been described with reference to some exemplary arrangements it will be understood that it is not intended to limit the teaching of the present invention to such arrangements as modifications can be made without departing from the spirit and scope of the present invention. In this way it will be understood that the invention is to be limited only insofar as is deemed necessary in the light of the appended claims.

Similarly the words comprises/comprising when used in the specification are used to specify the presence of stated features, integers, steps or components but do not preclude the presence or addition of one or more additional features, integers, steps, components or groups thereof.

The invention claimed is:
1. A semiconductor optical amplifier for amplifying an optical signal, the amplifier comprising:
an input for receiving the optical signal,
an output for outputting an amplified version of the optical signal,
a semiconductor active medium of substantially uniform dimensions defines an amplification path extending between the input and the output for amplifying the optical signal as the optical signal propagates along the amplification path, and a control arrangement being co-operable with the active medium and configured to selectively varying the carrier density along the amplification path so that the optical signal is preferentially amplified with respect to amplification of spontaneous emission associated with the active medium; the control arrangement comprises a lasing cavity defining a lasing portion and a non-lasing portion within the amplification path; the lasing cavity being arranged for clamping a predetermined percentage of the active medium to a predetermined gain value.

2. A semiconductor optical amplifier as claimed in claim 1, wherein the control arrangement is provided relative to the active medium such that a first portion of the amplification path contributes to a major part of the amplified spontaneous emission (ASE) associated with the SOA.

3. A semiconductor optical amplifier as claimed in claim 1, wherein the carrier density in the lasing portion is clamped to a predetermined gain value.

4. A semiconductor optical amplifier as claimed in claim 3, wherein the carrier density in the lasing portion is independent of a pumping current applied the SOA.

5. A semiconductor optical amplifier as claimed in claim 4, wherein the carrier density in the non-lasing portion is dependent on the pumping current applied to the SOA.

6. A semiconductor optical amplifier as claimed in claim 1, wherein the non-lasing portion of the amplification path contributes to a major part of the amplified spontaneous emission (ASE) associated with the SOA.

7. A semiconductor optical amplifier as claimed in claim 1, wherein the lasing portion of the amplification path contributes to a minor part of the amplified spontaneous emission (ASE) associated with the SOA.

8. A semiconductor optical amplifier as claimed in claim 1, wherein the lasing cavity is configured for facilitating transverse lasing with respect to the direction of the optical signal as the optical signal propagates along the amplification path.

9. A semiconductor optical amplifier as claimed in claim 1, wherein the noise figure of the non-lasing portion is less than the noise figure of the lasing portion.

10. A semiconductor optical amplifier as claimed in claim 1, wherein the noise figure of the non-lasing portion is substantially equal to the noise figure of the overall SOA.

11. A semiconductor optical amplifier as claimed in claim 1, wherein the longitudinal length of the lasing cavity is less than the longitudinal length of the active medium.

12. A semiconductor optical amplifier as claimed in claim 1, wherein the lasing cavity is arranged for clamping 20% to 90% of the active medium to a predetermined gain value.

13. A semiconductor optical amplifier as claimed in claim 1, wherein the lasing cavity is arranged for clamping 30% to 80% of the active medium to a predetermined gain value.

14. A semiconductor optical amplifier as claimed in claim 1, wherein the lasing cavity is arranged for clamping 40% to 70% of the active medium to a predetermined gain value.

15. A semiconductor optical amplifier as claimed in claim 1, wherein the lasing cavity is arranged for clamping 50% to 60% of the active medium to a predetermined gain value.

16. A semiconductor optical amplifier as claimed in claim 1, wherein the lasing cavity is arranged for clamping 60% to 70% of the active medium to a predetermined gain value.

17. A semiconductor optical amplifier as claimed in claim 1, wherein the lasing cavity is arranged offset relative to the input of the amplification path.

18. A semiconductor optical amplifier as claimed in claim 1, wherein the lasing cavity is located remotely of the input side of the active medium.

19. A semiconductor optical amplifier as claimed in claim 1, wherein the lasing cavity is located towards the output side of the active medium.

20. A semiconductor optical amplifier as claimed in claim 1, wherein the location of the lasing cavity in biased towards the output side of the active medium compared to the input side of the active medium.

21. A semiconductor optical amplifier as claimed in claim 1, wherein the lasing cavity includes a predetermined portion of the active medium.

22. A semiconductor optical amplifier as claimed in claim 1, wherein the carrier concentration gradient along the amplification path defines a maximum occurring in the non-lasing portion and a minimum occurring in the lasing portion.

23. A semiconductor optical amplifier as claimed in claim 22, wherein a pumping current may be applied to the SOA for shifting the maximum to a desirable value while the minimum is substantially unaffected by the pumping current.

24. A semiconductor optical amplifier as claimed in claim 1, wherein the lasing cavity comprises a pair of mirrors on respective opposites of the active medium for facilitating transverse lasing with respect to the direction of the optical signal as the optical signal propagates along the amplification path.

25. A semiconductor optical amplifier as claimed in claim 1, wherein the lasing cavity comprises a pair of mirrors in the active medium for facilitating transverse lasing with respect to the direction of the optical signal as the optical signal propagates along the amplification path.

26. A semiconductor optical amplifier as claimed in claim 1, wherein the control means is configured to divide the amplification path into a plurality of discrete sections each being independently biased with a corresponding pump current.

27. A semiconductor optical amplifier as claimed in claim 26, wherein the control means comprises a resistor network operably coupled to the active medium for facilitating applying current at varying levels to the respective subsections.

28. A semiconductor optical amplifier as claimed in claim 1, wherein at least one doping material is provided for supplying carriers to the active medium.

29. A semiconductor optical amplifier as claimed in claim 28, wherein the doping material comprises a P-type material for injecting holes into the active medium.

30. A semiconductor optical amplifier as claimed in claim 29, wherein the P-type material is provided as a P-type cladding layer.

31. A semiconductor optical amplifier as claimed in claim 28, wherein the doping material comprises an N-type material for injecting electrons into the active medium.

32. A semiconductor optical amplifier as claimed in claim 31, wherein the N-type material is provided as an N-type cladding layer.

33. A semiconductor optical amplifier as claimed in claim 30, wherein the P-type material and the N-type material and the active medium are arranged to form a SOA junction.

34. A semiconductor optical amplifier as claimed in claim 28, wherein the doping material is arranged to encapsulate the active medium.

35. A semiconductor optical amplifier as claimed in claim 28, wherein at least one electrical contact is provided on the doping material for facilitating pumping carriers into the active medium.

36. A semiconductor optical amplifier as claimed in claim 28, wherein a plurality of electrical contacts are provided on the doping material for facilitating pumping carriers into the active medium.

37. A semiconductor optical amplifier as claimed in claim 35, wherein a platform is provided for supporting the at least one electrical contact thereon.

38. A semiconductor optical amplifier as claimed in claim 37, wherein the platform is provided by a ridge of doping material.

39. A semiconductor optical amplifier as claimed in claim 37, wherein the electrical contact is in registration with the active medium.

40. A semiconductor optical amplifier as claimed in claim 1, further including an arrangement for pumping current to the semiconductor active medium.

41. A semiconductor optical amplifier as claimed in claim 1 wherein the active medium defines a single mode waveguide.

42. A signal processing element comprising the SOA as claimed in claim 1.

43. An electronic chip incorporating the SOA as claimed in claim 1.

44. A semiconductor optical amplifier for amplifying an optical signal, the amplifier comprising:
   an input for receiving the optical signal,
   an output for outputting an amplified version of the optical signal,
   a semiconductor active medium of substantially uniform dimensions defines an amplification path extending between the input and the output for amplifying the optical signal as the optical signal propagates along the amplification path, and
   a lasing cavity arranged to incorporate a portion of the active medium such that the lasing cavity defines a lasing portion and a non-lasing portion within the amplification path for selectively varying the carrier density along the amplification path so that the optical signal is preferentially amplified with respect to amplification of spontaneous emission associated with the active medium; the lasing cavity being arranged for clamping a predetermined percentage of the active medium to a predetermined gain value.

* * * * *